(12) United States Patent
Fujii

(10) Patent No.: US 8,621,264 B2
(45) Date of Patent: Dec. 31, 2013

(54) BACKUP LINE ALLOCATION APPARATUS, MEMORY REPAIRING APPARATUS, BACKUP LINE ALLOCATION METHOD, MEMORY MANUFACTURING METHOD, AND RECORDING MEDIUM

(75) Inventor: Toshiro Fujii, Saitama (JP)

(73) Assignee: Advantest Corporation, Tokyo (JP)

( * ) Notice: Subject to any disclaimer, the term of this patent is extended or adjusted under 35 U.S.C. 154(b) by 1012 days.

(21) Appl. No.: 12/693,053

(22) Filed: Jan. 25, 2010

(65) Prior Publication Data

US 2010/0169705 A1   Jul. 1, 2010

Related U.S. Application Data

(63) Continuation of application No. PCT/JP2007/064670, filed on Jul. 26, 2007.

(51) Int. Cl.
*G06F 11/00* (2006.01)
(52) U.S. Cl.
USPC ............... 714/6.1; 714/6.3; 714/6.32
(58) Field of Classification Search
USPC ............................. 714/6.1, 25, 42
See application file for complete search history.

(56) References Cited

U.S. PATENT DOCUMENTS

| | | | |
|---|---|---|---|
| 6,295,237 | B1 | 9/2001 | Poechmuller |
| 6,535,993 | B1 | 3/2003 | Hamada et al. |

FOREIGN PATENT DOCUMENTS

| | | |
|---|---|---|
| JP | 2-24899 A | 1/1990 |
| JP | 2000-311497 A | 11/2000 |
| JP | 2000-348498 A | 12/2000 |
| JP | 2003-007090 A | 1/2003 |
| JP | 2006-252626 A | 9/2006 |

OTHER PUBLICATIONS

International Search Report (ISR) issued in PCT/JP2007/064670 (parent application) for Examiner consideration, citing U.S. Patent Nos. 1-2 and Foreign Patent Document Nos. 2-5 listed above.
Written Opinion (PCT/ISA/237) issued in PCT/JP2007/064670 (parent application).

*Primary Examiner* — Sarai Butler

(57) ABSTRACT

Provided is a backup line allocation apparatus that determines which fail lines, in a memory provided with a plurality of backup lines, to allocate the backup lines to, comprising a bit counting section that, for each fail bit contained in each fail line, counts a number of orthogonal fail bits, which is a number of fail bits in a fail line that includes the each fail bit and has an orientation that differs from the orientation of the each fail line, and stores the number of orthogonal fail bits associated with the each fail bit; a weight calculating section that calculates a weighting coefficient for each fail line based on the number of orthogonal fail bits of the fail bits contained in the each fail line, and stores the weighting of the each fail line; and an allocating section that determines which of the fail lines to allocate the backup lines to, based on the relative sizes of the weighting coefficients calculated by the weight calculating section.

18 Claims, 15 Drawing Sheets

BACKUP LINE ALLOCATION APPARATUS, MEMORY REPAIRING APPARATUS, BACKUP LINE ALLOCATION METHOD, MEMORY MANUFACTURING METHOD, AND RECORDING MEDIUM

CROSS REFERENCE TO RELATED APPLICATION

This is a continuation application of PCT/JP2007/064670 filed on Jul. 26, 2007.

BACKGROUND

1. Technical Field

The present invention relates to a backup line allocation apparatus, a memory repairing apparatus, a backup line allocation method, a memory manufacturing method, and a recording medium. In particular, the present invention relates to a backup line allocation apparatus that determines which fail lines have backup lines allocated thereto in a memory, such as a semiconductor memory, provided with a plurality of backup lines.

2. Related Art

A conventional semiconductor memory has storage cells arranged in a two-dimensional matrix. When manufacturing such a semiconductor memory, the memory is desirably designed such that all of the storage cells operate properly. However, since recent semiconductor memories have an extremely large number of storage cells, it is difficult for all of the cells to operate properly.

One known method for dealing with this problem involves forming a semiconductor memory having a prescribed number of backup lines for address lines in rows and columns in the matrix of storage cells. In such a semiconductor memory, the address lines that have defective storage cells, known as "fail bits," are replaced with backup lines to repair a semiconductor memory having defective storage cells, as in, for example, Japanese Patent Application Publication No. 2-24899.

There is a limit, however, to the number of backup lines that can be formed in a semiconductor memory. Therefore, if the backup lines are not appropriately allocated to the address lines that have fail bits, not all of the fail bits can be repaired. Recent semiconductor memories have a huge number of address lines, and therefore it takes an extremely long time to find the proper backup line allocation that allows all of the fail bits to be repaired. Therefore, a technique is desired to efficiently detect the allocation of backup lines that allows all of the fail bits to be repaired.

SUMMARY

Therefore, it is an object of an aspect of the innovations herein to provide a backup line allocation apparatus, a memory repairing apparatus, a backup line allocation method, a memory manufacturing method, and a recording medium, which are capable of overcoming the above drawbacks accompanying the related art. The above and other objects can be achieved by combinations described in the independent claims. The dependent claims define further advantageous and exemplary combinations of the innovations herein.

According to a first aspect of the present invention, provided is a backup line allocation apparatus that determines which fail lines, from among row-oriented fail and column-oriented fail lines containing fail bits in a memory provided with a plurality of backup lines, to allocate the backup lines to, comprising a bit counting section that, for each fail bit contained in each fail line, counts a number of orthogonal fail bits, which is a number of fail bits in a fail line that includes the each fail bit and has an orientation that differs from the orientation of the each fail line, and stores the number of orthogonal fail bits associated with the each fail bit; a weight calculating section that calculates a weighting coefficient for each fail line based on the number of orthogonal fail bits of the fail bits contained in the each fail line, and stores the weighting coefficient associated with the each fail line; and an allocating section that determines which of the fail lines to allocate the backup lines to, based on the relative sizes of the weighting coefficients calculated by the weight calculating section.

According to a second aspect of the present invention, provided is a memory repairing apparatus that repairs fail bits of a memory provided with a plurality of backup lines, comprising a backup line allocation apparatus that determines which fail lines, from among row-oriented fail lines and column-oriented fail lines containing fail bits in the memory, to allocate the backup lines to; and a setting section that sets the allocation determined by the backup line allocation apparatus in the memory. The backup hue allocation apparatus includes a bit counting section that, for each fail bit contained in each fail line, counts a number of orthogonal fail bits, which is a number of fail bits in a fail line that includes the each fail bit and has an orientation that differs from the orientation of the each fail line, and stores the number of orthogonal fail hits associated with the each fail bit; a weight calculating section that calculates a weighting coefficient for each fail line based on the number of orthogonal fail bits of the fail bits contained in the each fail line, and stores the weighting coefficient associated with the each fail line; and an allocating section that determines which of the fail lines to allocate the backup lines to, based on the relative sizes of the weighting coefficients calculated by the weight calculating section.

According to a third aspect of the present invention, provided is a backup line allocation method for determining which fail lines, from among row-oriented fail lines and column-oriented fail lines containing fail bits in a memory provided with a plurality of backup lines, to allocate the backup lines to, comprising, for each fail bit contained in each fail line, counting a number of orthogonal fail bits, which is a number of fail bits in a fail line that includes the each fail bit and has an orientation that differs from the orientation of the each fail line, and storing the number of orthogonal fail bits associated with the each fail bit; calculating a weighting coefficient for each fail line based on the number of orthogonal fail bits of the fail bits contained in the each fail line, and storing the weighting coefficient associated with the each fail line; and determining which of the fail lines to allocate the backup lines to, based on the relative sizes of the weighting coefficients.

According to a fourth aspect of the present invention, provided is a memory manufacturing method for manufacturing a memory, comprising forming the memory provided with a plurality of backup lines; and repairing the memory by determining which fail lines, from among row-oriented fail lines and column-oriented fail lines containing fail bits in the formed memory, to allocate the backup up lines to. Repairing the memory includes, for each fail bit contained in each fail line, counting a number of orthogonal fail bits, which is a number of fail hits in a fail line that includes the each fail bit and has an orientation that differs from the orientation of the each fail line, and storing the number of orthogonal fail bits associated with the each fail bit; calculating a weighting coefficient for each fail line based on the number of orthogonal fail hits of the fail bits contained in the each fail line, and storing the weighting coefficient associated with the each fail line; and determining which of the fail lines to allocate the backup lines to, based on the relative sizes of the weighting coefficients.

According to a fifth aspect of the present invention, provided is a recording medium storing thereon a program that causes a computer to function as a backup line allocation apparatus that determines which fail lines, from among row-oriented fail lines and column-oriented fail lines containing fail bits in a memory provided with a plurality of backup lines, to allocate the backup lines to, the program causing the computer to function as a bit counting section that, for each fail bit contained in each fail line, counts a number of orthogonal fail bits, which is a number of fail bits in a fail line that includes the each fail bit and has an orientation that differs from the orientation of the each fail line, and stores the number of orthogonal fail bits associated with the each fail bit; a weight calculating section that calculates a weighting coefficient for each fail line based on the number of orthogonal fail bits of the fail bits contained in the each fail line, and stores the weighting coefficient associated with the each fail line; and an allocating section that determines which of the fail lines to allocate the backup lines to, based on the relative sizes of the weighting coefficients calculated by the weight calculating section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
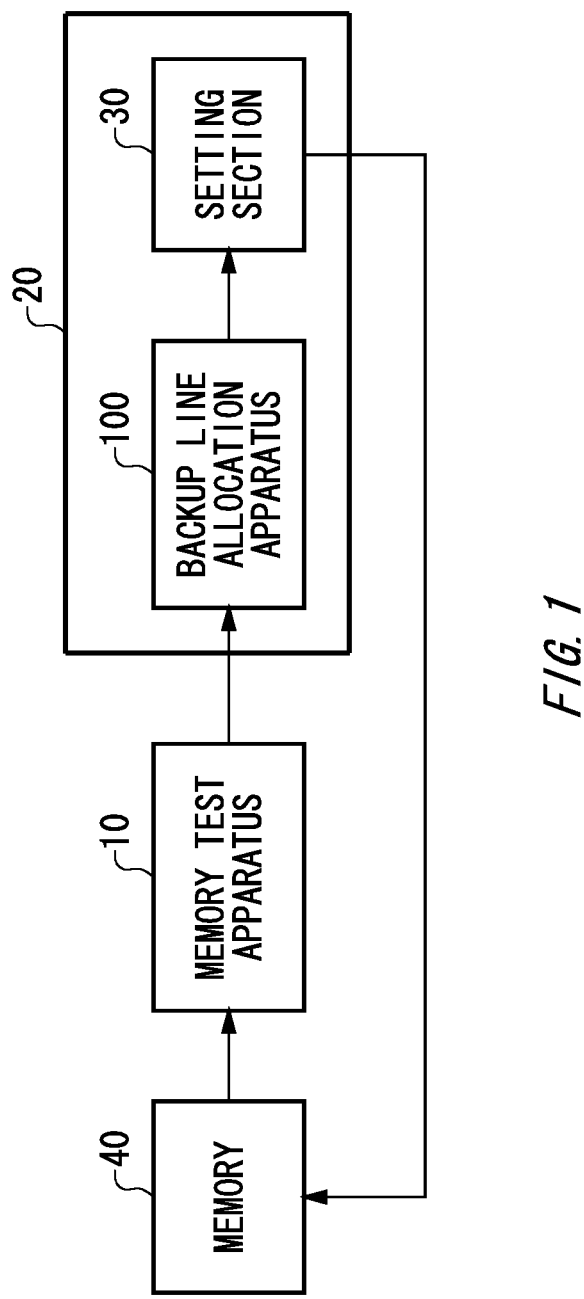
FIG. 1 shows an exemplary memory test apparatus 10 for testing a memory 40, such as a semiconductor memory, and a memory repairing apparatus 20 for repairing fail bits of the memory 40.

FIG. 1 shows an exemplary memory test apparatus 10 for testing a memory 40, such as a semiconductor memory, and a memory repairing apparatus 20 for repairing fail bits of the memory 40. The memory test apparatus 10 tests whether each storage cell of the memory 40 under test is operating properly. The memory test apparatus 10 may input, to the line repairing section 20, fail data indicating whether each cell of the memory 40 is a fail bit. The memory 40 may be a semiconductor memory in which the storage cells are arranged in a two-dimensional matrix. The memory 40 may be provided with a prescribed number of backup lines corresponding to address lines oriented as rows and columns in the matrix of storage cells.

The memory repairing apparatus 20 is provided with a backup line allocation apparatus 100 and a setting section 30. The backup line allocation apparatus 100 receives fail data concerning the memory 40 from the memory test apparatus 10. Based on this fail data, the backup line allocation apparatus 100 determines which fail lines the backup lines are allocated to, from among the address lines of the memory 40 containing fail bits in rows or columns, that is, row-oriented fail lines and column-oriented fail lines. Here, a "fail line" may refer to an address line that includes a fail bit in a row or column thereof. The setting section 30 sets the backup line allocation determined by the backup line allocation apparatus 100 in the memory 40. For example, the setting section 30 may set the allocation in the memory 40 by using a laser or the like to cut the wiring of the memory 40 according to the allocation of the backup lines. Through this process, a memory 40 in which the fail bits are repaired can be manufactured.

Figure 2:
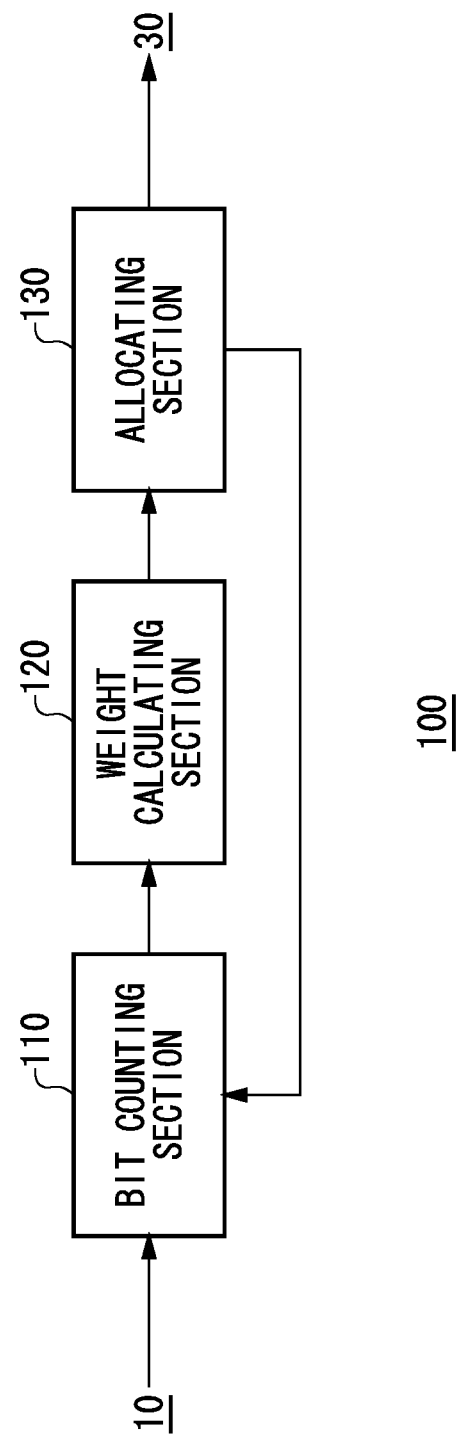
FIG. 2 shows an exemplary configuration of the backup line allocation apparatus 100.

FIG. 2 shows an exemplary configuration of the backup line allocation apparatus 100. The backup line allocation apparatus 100 includes a bit counting section 110, a weight calculating section 120, and an allocating section 130. The bit counting section 110 receives the fail data concerning the memory 40 from the memory test apparatus 10.

Figure 3:
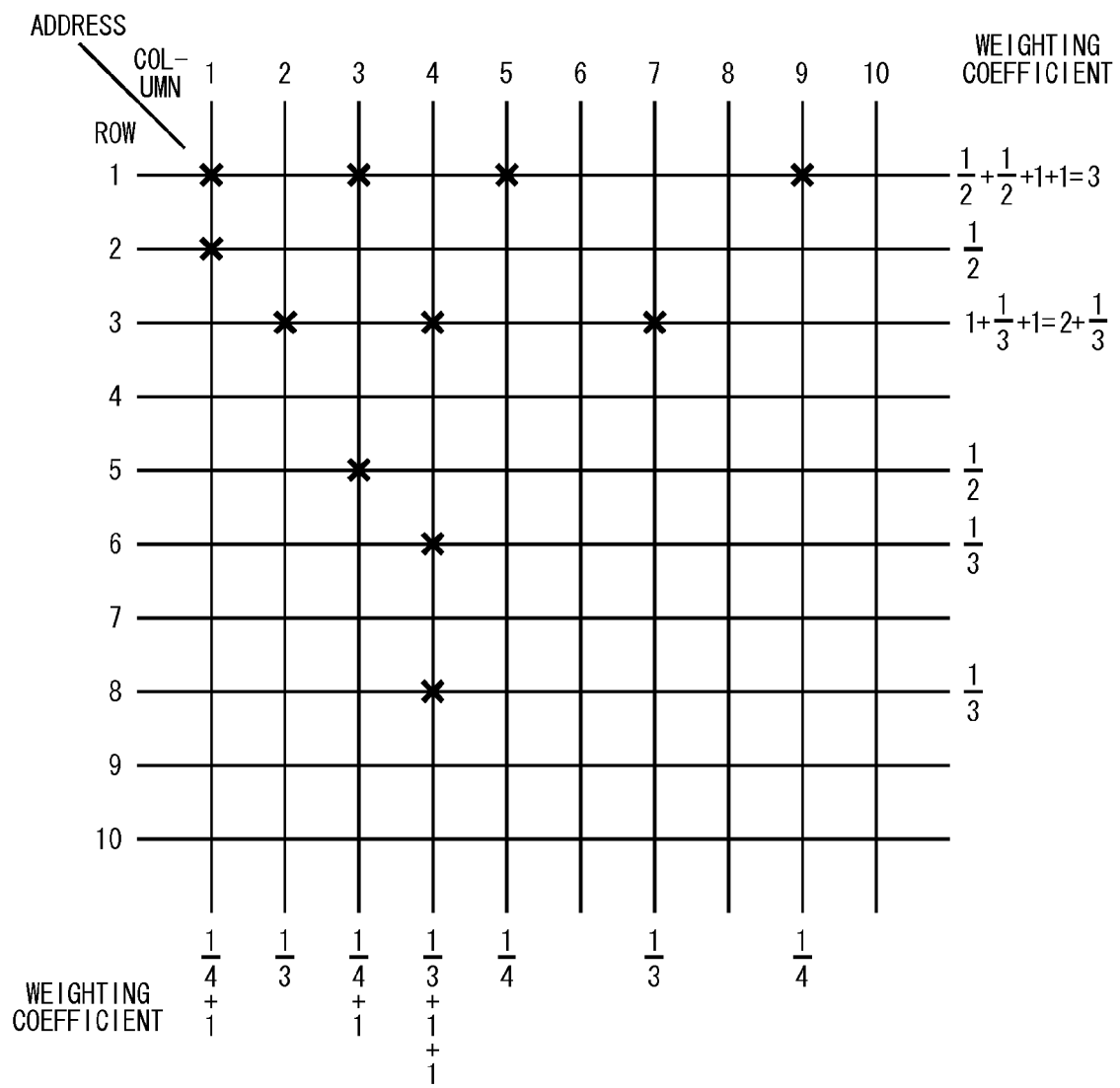
FIG. 3 shows exemplary fail data concerning the memory 40.

FIG. 3 shows exemplary fail data concerning the memory 40. The bit counting section 110 may receive the fail data as a bit map, as shown in FIG. 3. The bit counting section 110 may include a bit map memory that stores this bit map. The exemplary memory 40 shown in FIG. 3 has 10 address lines in each row and column. Furthermore, the each point at which address lines intersect corresponds to a 1-bit storage cell. The fail bits in the memory 40 are indicated by an X. In the present example, the memory 40 has fail bits at (1, 1), (1, 3), (1, 5), (1, 9), (2, 1), (3, 2), (3, 4), (3, 7), (5, 3), (6, 4), and (8, 4), where the first number indicates the row address and the second number indicates the column address.

For each fail bit included in a given fail line, i.e. the row address lines 1, 2, 3, 5, 6, and 8 and the column address lines 1, 2, 3, 4, 5, 7, and 9, the bit counting section 110 counts the number of orthogonal fail bits, which is the number of fail bits in a fail line that includes the fail bit and whose orientation differs from the given fail line. For example, the number of orthogonal fail bits in the row address line n of the fail bit (n, m) is the number of fail bits in the column address line m, which includes the fail bit (n, m) and is orthogonal to the row address line n. Here, n and m are integers. The number of orthogonal fail bits in the column address line m of the fail bit (n, m) is the number of fail bits in the row address line n, which includes the fail bit (n, m) and is orthogonal to the column address line m.

More specifically, the number of orthogonal fail bits in the row address line 1 of the fail bit (1, 1) is 2, which is the number of fail bits in column address line 1. The number of orthogonal fail bits in the column address line 1 of the fail bit (1, 1) is 4, which is the number of fail bits in row address line 1.

For each fail bit (n, m), the bit counting section 110 counts the number of orthogonal fail bits in the row address line n and the number of orthogonal fail bits in the column address line m, and stores both of these counts for each fail bit. The bit counting section 110 may have a row bit number register that stores the number of orthogonal fail bits in the row address hue and a column bit number register that stores the number of orthogonal fail bits in the column address line, for each bit of the memory 40.

The weight calculating section 120 calculates a weighting coefficient for each fail line of each fail bit based on the number of orthogonal fail bits of each fail bit in the fail line. For example, the weight calculating section 120 may calculate the coefficient to be smaller for a fail bit that has a large number of orthogonal fail bits. The weight calculating section 120 may calculate the weighting coefficient of a fail line to be the sum of the weighting coefficients of the fail bits in the fail line.

More specifically, by sequentially allocating backup lines to fail lines having greater numbers of fail bits, a greater number of fail bits can be repaired. However, since each storage cell of the memory 40 is formed on a prescribed surface of the memory 40, the storage cells are desirably formed as a two-dimensional matrix and have row address lines and column address lines. Therefore, each fail bit can be repaired through both the row address line and the column address line. At this time, if both a backup line for a row address line and a backup line for a column address line are allocated to one fail bit, the total number of fail bits that can be repaired decreases.

Therefore, the backup line allocation apparatus 100 can obtain a coefficient indicating whether each fail bit is to be repaired through a row address line or through a column address line, by calculating the number of orthogonal fail bits in the row address line and in the column address line. Then, the weighting coefficient for allocating the backup lines can be obtained for each fail bit by calculating the sum of the coefficients of the fail bits in each fail line.

More specifically, the weight calculating section 120 may calculate the weighting coefficient of a fail line based on the sum of the reciprocals of the numbers of orthogonal fail bits of the fail bits in the fail line. For example, the numbers of orthogonal fail bits for the fail bits (1, 1), (1, 3), (1, 5) and (1, 9) in row address line 1 are 2, 2, 1, and 1, respectively. The weight calculating section 120 may calculate the weighting coefficient for line 1 to be the sum of the reciprocals of the numbers of these orthogonal fail bits, i.e. the weighting coefficient may be calculated as ½+½+1/1+1/1=3. The weighting coefficient calculating section 120 may calculate and store a weighting coefficient for each fail line. The weighting coefficient calculating section 120 may include a weighting register for each address line to store the weighting coefficient of the address line.

The allocating section 130 determines which fail lines to allocate the backup lines to based on the sizes of the weighting coefficients calculated by the weight calculating section 120. For example, the allocating section 130 may allocate backup lines to the fail lines whose weighting coefficients are larger. In the example of FIG. 3, row address line 1 has the largest weighting coefficient, and so the allocating section 130 allocates a row-oriented backup line to row address line 1.

The allocating section 130 may be notified in advance concerning the number of column-oriented and row-oriented backup lines in the memory 40. For example, a user may notify the allocating section 130 in advance concerning the number of backup lines. The allocating section 130 may have an initial backup line number register that stores the number of row-oriented backup lines and the number of column-oriented backup lines according to the notification. The allocating section 130 may also have a remaining backup line number register that stores the number of remaining backup lines of each orientation, where this number is calculated by subtracting from a backup line of a certain orientation when a backup line of this orientation is allocated to a fail line. The allocating section 130 may allocate a backup line of a certain orientation to a fail line on a condition that the number of remaining backup lines of this orientation is not zero.

Figure 4:
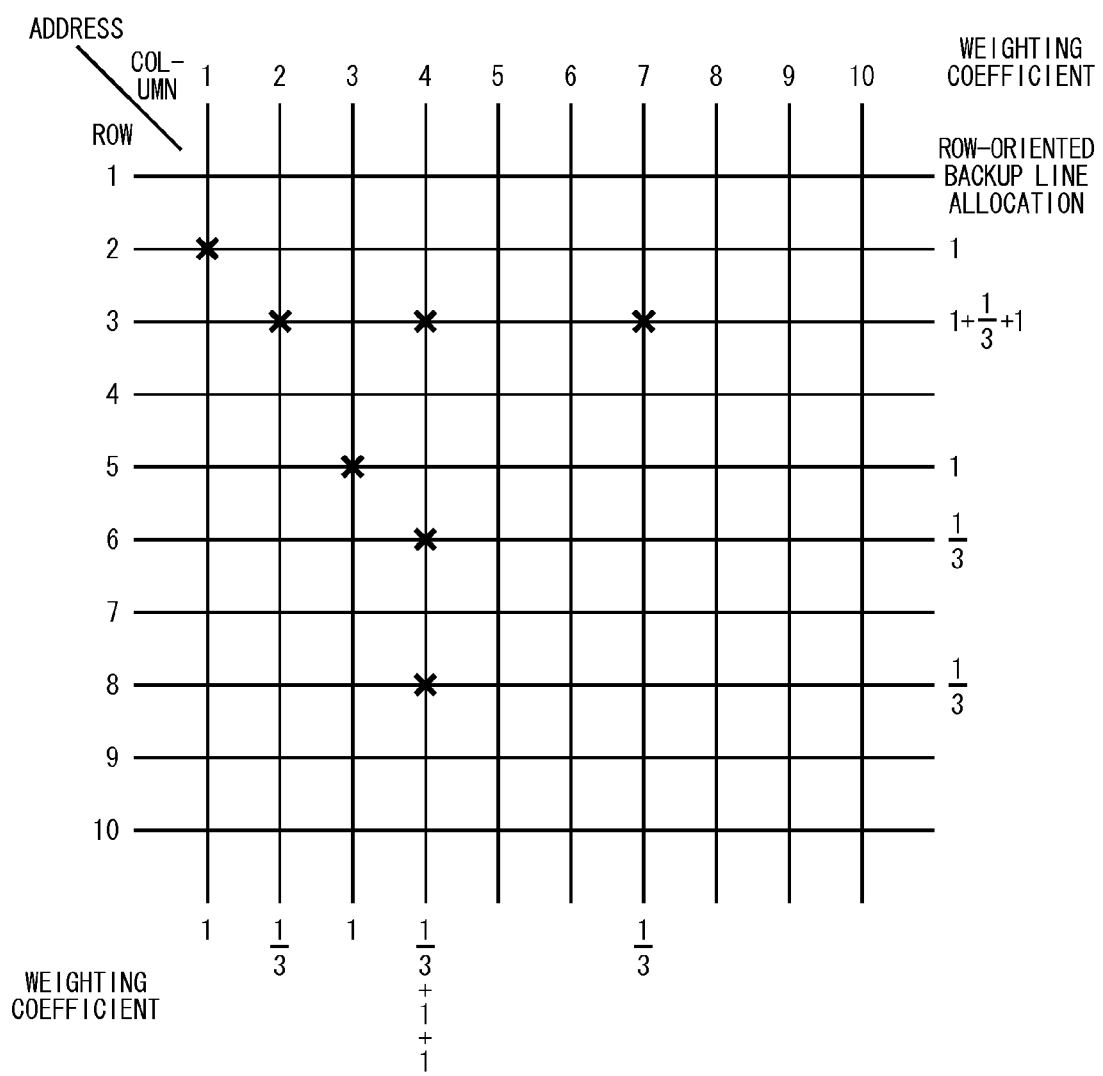
FIG. 4 describes an exemplary process of the backup line allocation apparatus 100.

FIG. 4 describes an exemplary process of the backup line allocation apparatus 100. As described in relation to FIG. 3, the allocating section 130 allocates a backup line having the appropriate orientation to the fail line with the largest weighting coefficient, i.e. row address line 1 in FIG. 3. At this time, the allocating section 130 may notify the bit counting section 110 that a backup line has been allocated to this fail line.

The bit counting section 110 calculates the number of orthogonal fail bits in the row and column of each fail bit while excluding the fail bits in fail lines to which backup line have been allocated. The bit counting section 110 may further include an updated bit map memory that stores a bit map of fail data from which fail bits in fail lines to which backup lines are allocated are removed.

The bit counting section 110 of the present embodiment recalculates the number of orthogonal fail bits for each fail bit using the bit map shown in FIG. 4 in which the fail bits in row address line 1 have been repaired. The bit counting section 110 may further include row-oriented and column-oriented recalculated bit number registers that store the recalculated number of orthogonal fail bits in the corresponding row and column for each fail bit.

The weight calculating section 120 calculates the weighting coefficient of each fail line while excluding fail bits in fail lines to which backup lines have been allocated, based on the newly stored number of orthogonal Fail bits recalculated by the bit counting section 110. For example, the weighting coefficient in row address line 2 in FIG. 4 is recalculated from ½ to be 1 after the fail bits in row address line 1 are repaired. The weight calculating section 120 recalculates and stores a weighting coefficient for each fail line. The weight calculating section 120 may further include, for each address line, an updated weighting register that stores the weighting coefficient recalculated for the corresponding address line.

The allocating section 130 selects the next fail line to which a backup line is to be allocated based on the new weighting coefficients stored by the weight calculating section 120. For example, the allocating section 130 may allocate the next backup line to the fail line that has the largest updated weighting coefficient. Situations might arise in which different address lines have the same weighting coefficient, such as row address line 3 and column address line 4 in FIG. 4. In such a case, the allocating section 130 prioritizes a fail line with the orientation designated in advance by a user or the like when allocating backup lines. Instead, the allocating section 130 may prioritize the fail line whose orientation corresponds to whichever orientation of backup line has a greater number remaining when allocating backup lines. As another example, the allocating section 130 may simultaneously allocate backup lines to a plurality of fail lines having the same weighting coefficient.

By repeating the process described above, the backup lines can be allocated in a manner to maximize the number of fail bits that are repaired. Therefore, the backup line allocation apparatus 100 can efficiently detect a backup line allocation that can repair all of the fail bits.

Figure 5:
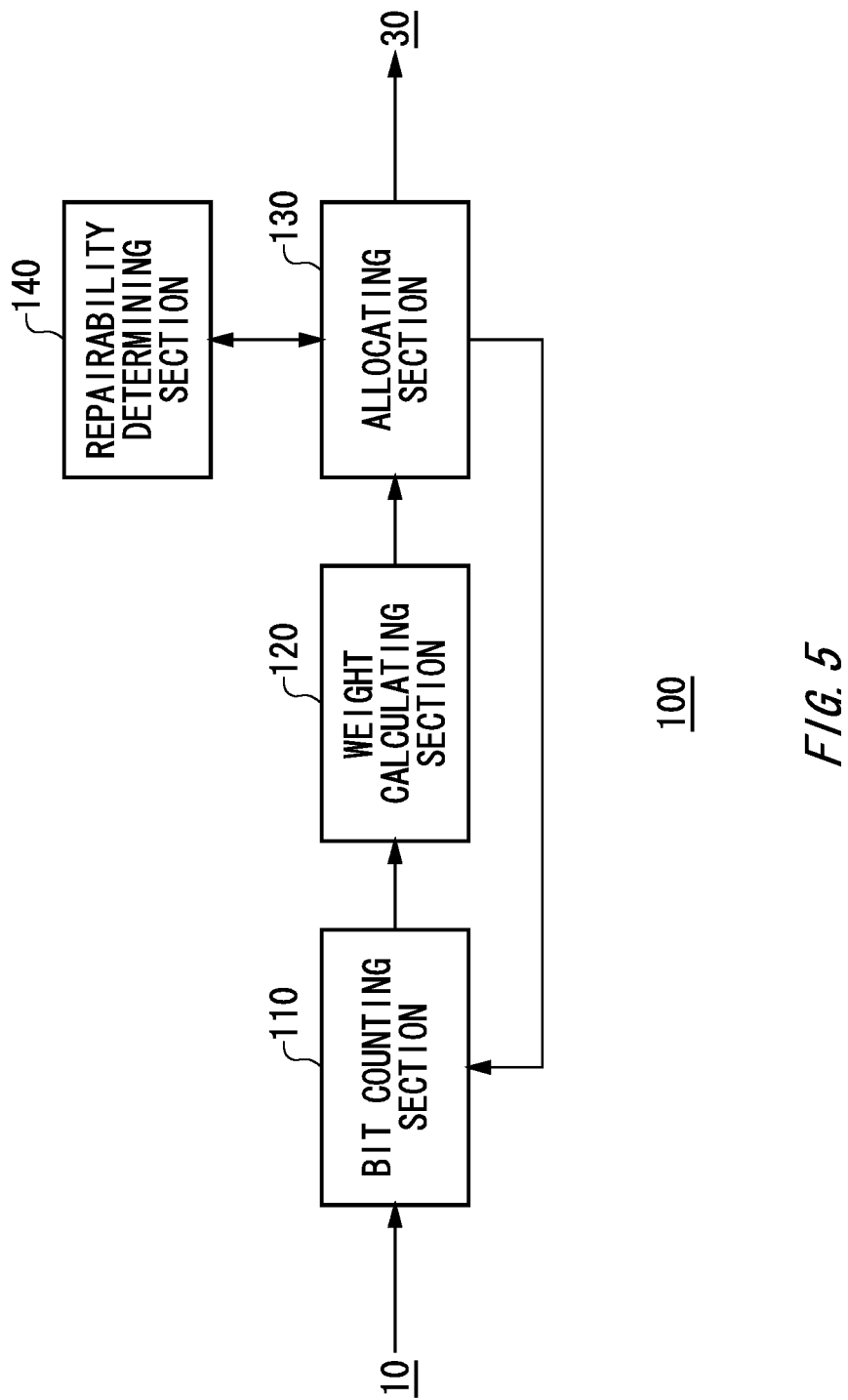
FIG. 5 shows another exemplary configuration of the backup line allocation apparatus 100.

FIG. 5 shows another exemplary configuration of the backup line allocation apparatus 100. The backup line allocation apparatus 100 of the present embodiment includes a repairability determining section 140 in addition to the configuration of the backup line allocation apparatus 100 described in relation to FIGS. 1 to 4. Other components of the backup line allocation apparatus 100 of the present embodiment may be the same as those of the backup line allocation apparatus 100 described in relation to FIGS. 1 to 4.

The repairability determining section 140 determines whether all of the fail bits can be repaired by sequentially allocating the backup lines as described in relation to FIGS. 1 to 4. For example, the repairability determining section 140 may determine, each time the allocating section 130 allocates a backup line to a fail line, whether there is a chance that all of the fail bits can be repaired.

For example, the repairability determining section 140 may determine that there is no chance of repairing all of the fail bits when the number of remaining backup lines reaches zero while unrepaired fail bits still remain. Even when there are still remaining backup lines, the repairability determining section 140 may determine whether there is a chance that all of the fail bits can be repaired using a different method, such as the method described further below in relation to FIGS. 10 to 12.

The allocating section 130 may notify the repairability determining section 140 concerning which fail lines the backup lines are allocated to. The repairability determining section 140 may determine whether there is a chance of all of the fail bits being repaired, based on the content of the notification and the information stored in each memory and each register in the bit counting section 110, the weight calculating section 120, and the allocating section 130.

For example, the repairability determining section 140 may determine that there is no chance of repairing all of the fail bits when, as a result of allocating the backup lines to the fail lines, the number of lines stored in the remaining backup line number register of the allocating section 130 reaches zero and the bit map stored in the updated bit map memory of the bit counting section 110 contains fail data. As another example, the repairability determining section 140 may determine that there is no chance of repairing all of the fail bits when, as a result of allocating the backup lines to the fail lines, the number of remaining backup lines of one of the orientations reaches zero and the number of remaining backup lines of the other orientation is less than the number of fail lines having the second orientation.

Figure 6:
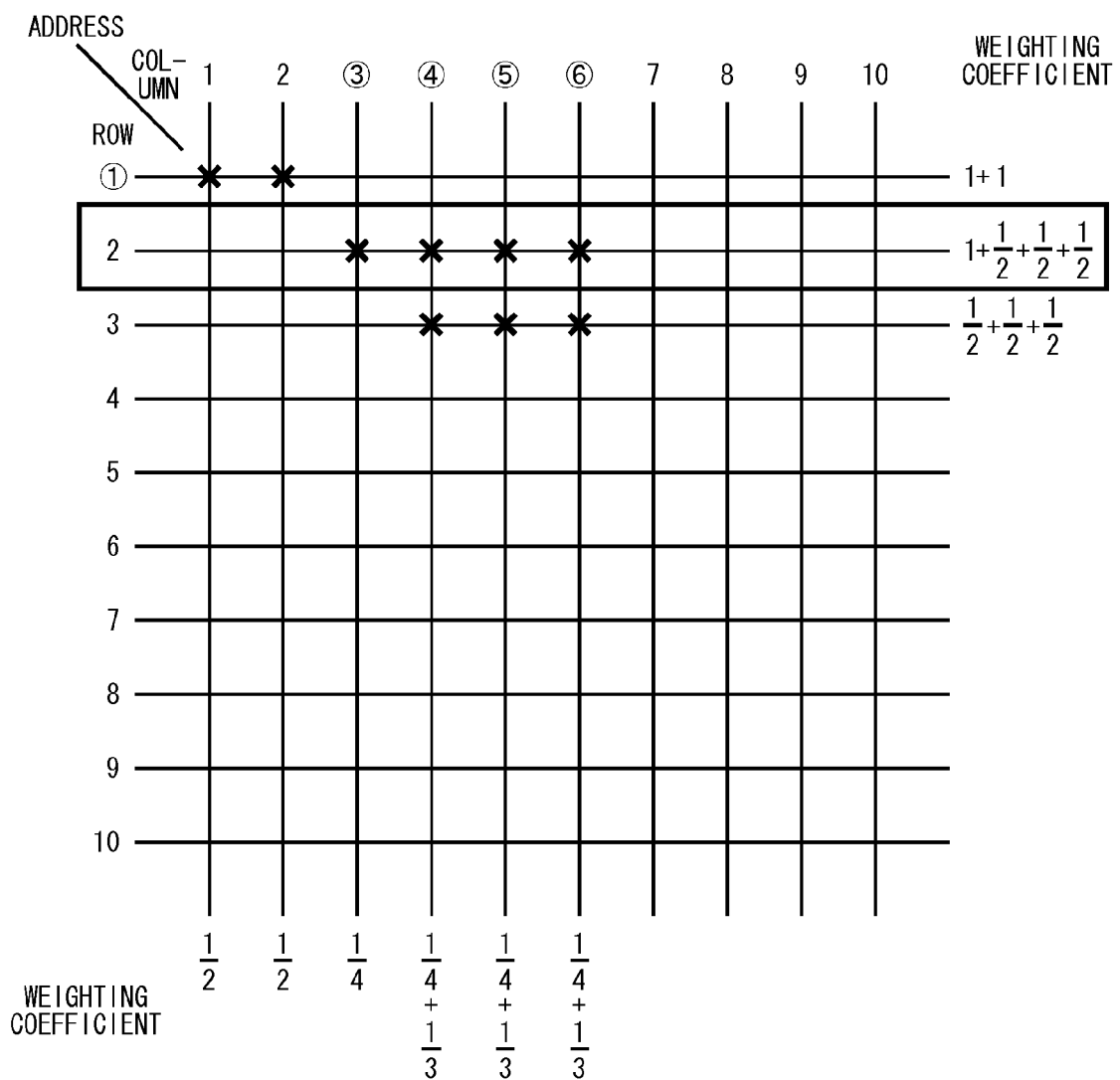
FIG. 6 shows an exemplary process of the backup line allocation apparatus 100 shown in FIG. 5.

FIG. 6 shows an exemplary process of the backup line allocation apparatus 100 shown in FIG. 5. In this example, fail bits occur at (1, 1), (1, 2), (2, 3, (2, 4), (2, 5), (2, 6), (3, 4), (3, 5), and (3, 6), where the first number is the row address and the second number is the column address. Furthermore, FIG. 6 shows a first state in which one row-oriented backup line and four column-oriented backup lines remain. The first state shown in FIG. 6 may be the initial state of the memory 40, or may be a state reached after several backup lines have been allocated according to the process described in relation to FIGS. 1 to 5.

As described in relation to FIGS. 1 to 4, the weight calculating section 120 calculates a weighting coefficient for each address line. The allocating section 130 allocates a backup line to the fail line having the largest weighting coefficient. In the example of FIG. 6, row address line 2 has the largest weighting coefficient, and so a row-oriented backup line is allocated to row address line 2. As a result, the number of remaining row-oriented backup lines decreases to zero. Furthermore, the number of column-oriented fail lines becomes five, which is greater than the four remaining column-oriented backup lines. In such a case, the repairability determining section 140 notifies the allocating section 130 that some of the fail bits cannot be repaired.

Upon receiving the notification, the allocating section 130 revokes the allocation of the backup line to a first fail line, which is one of the fail lines to which a backup line has been allocated. In the example of FIG. 6, the allocating section 130 revokes the allocation of the backup line to the first fail line that is the row address line 2 to which the most recent backup line was allocated. At this time, the content of each register and each memory in the bit counting section 110, the weight calculating section 120, and the allocating section 130 is returned to the state prior to allocation of the backup line to the first fail line.

For example, when the repairability determining section 140 determines that some of the fail bits cannot be repaired, the weight calculating section 120 may recalculate the weighting coefficient to have the value prior to allocation of the backup line to the first fail line. Instead, the bit counting section 110, the weight calculating section 120, and the allocating section 130 may each include a cache memory that stores the state of each register and memory for each allocation of a backup line to a fail line.

Furthermore, upon receiving notification from the repairability determining section 140 that some of the fail bits cannot be repaired, the allocating section 130 selects a second fail line for each fail bit in the first fail line, each second fail line including one of the fail bits in the first fail line and having an orientation differing from the orientation of the first fail line, and allocates backup lines to the selected second fail lines. In the example of FIG. 6, the allocating section 130 allocates column-oriented backup lines to the four row column address lines 3, 4, 5, and 6, which are address lines orthogonal to row address line 2 and including the fail bits (2, 3), (2, 4), (2, 5), and (2, 6) of row address line 2.

Since the number of address lines selected as second fail lines is no greater than the number of remaining backup lines having the corresponding orientation, the repairability determining section 140 notifies that allocating section 130 that there is a chance that all of the fail bits can be repaired. The bit counting section 110 and the weight calculating section 120 recalculate the fail data bit map, the number of orthogonal fail bits, the weighting coefficients, and the like for the state resulting from the backup lines being allocated to the second fail lines.

The allocating section 130 selects the next fail line to which a backup line is to be allocated based on the recalculated weighting coefficients. In the present example, row address line 1 now has the largest weighting coefficient, and so the allocating section 130 allocates a row-oriented backup line to row address line 1. At this time, the number of remaining row-oriented backup lines is not zero and no fail bits are present after the allocation of the backup line, and so the repairability determining section 140 may notify the allocating section 130 that this allocation enables all of the fail bits to be repaired. Upon receiving this notification, the allocating section 130 sets the state of the backup line allocation and notifies the setting section 30.

As described above, when it is determined that setting a backup line to the first fail line results in there being no chance of repairing all of the fail bits, the backup line allocation apparatus 100 can revoke the allocation to the first fail line so that a search for a suitable backup line allocation with a backup line already set to the first fail line, and any following processes, are not performed. As a result, the processing time can be decreased. Furthermore, when a backup line is not set for the first fail line, the fail bits in the first fail line cannot be repaired if backup lines are not allocated to the orthogonal second fail lines. When the allocation to the first fail line is revoked, as in the present example, the efficiency of the search for suitable backup line allocation can be improved by irrevocably allocating backup lines to the second fail lines orthogonal to the first fail line.

If the number of address lines selected as second fail lines is greater than the number of remaining backup lines having the corresponding orientation, the repairability determining section 140 notifies the allocating section 130 that there is no chance that all of the fail bits can be repaired. In such a case, there is no allocation of backup lines that enables all of the fail bits to be repaired for this combination of remaining backup lines and remaining fail bits in the first state.

Therefore, the allocating section 130 further revokes the allocation of a backup line to a fail line that was performed immediately before reaching the first state. In other words, the allocating section 130 further revokes the backup line allocation that resulted in the remaining fail bits and the remaining backup lines reaching the first state. The allocating section 130 then irrevocably allocates backup lines to the fail lines that include the fail bits of the fail line whose allocation was revoked and that are orthogonal to the fail line whose allocation was revoked.

In this way, when there is no chance that all of the fail bits can be repaired, the backup line allocation apparatus 100 sequentially revokes backup line allocations and irrevocably allocates backup lines to fail lines that are orthogonal to the fail lines whose allocations were revoked. Then, by searching for a suitable backup line allocation, the backup line allocation apparatus 100 can efficiently detect a suitable allocation.

Figure 7:
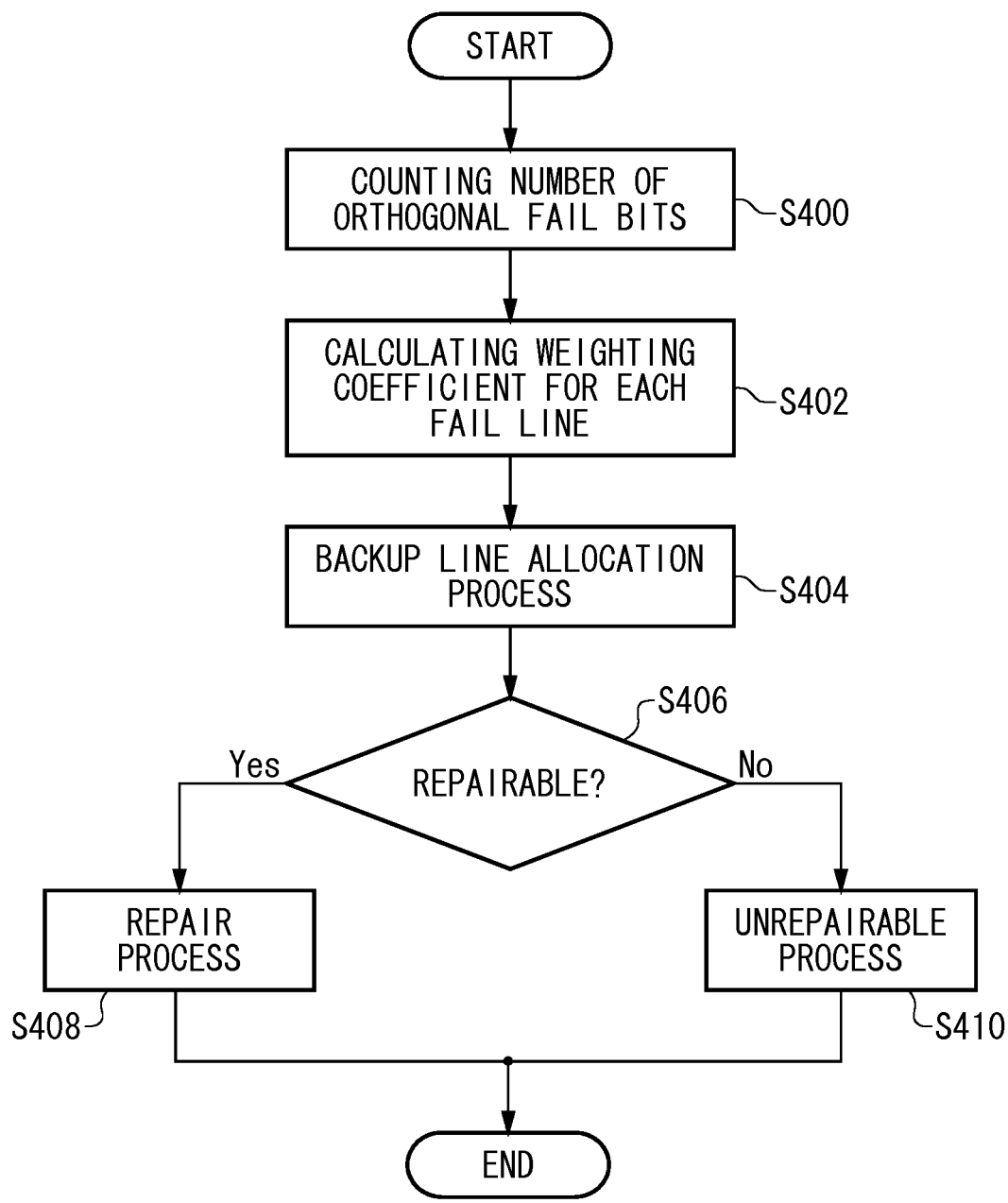
FIG. 7 is a flow chart showing an exemplary operation of the backup line allocation apparatus 100 described in relation to FIGS. 1 to 6.

FIG. 7 is a flow chart showing an exemplary operation of the backup line allocation apparatus 100 described in relation to FIGS. 1 to 6. First, as described above, the bit counting section 110 counts the number of orthogonal fail bits in the row and column of each fail bit (S400).

Next, the weight calculating section 120 calculates the weighting coefficient of each fail line based on the number of orthogonal fail bits of the fail bits in each fail line (S402). The backup line allocation apparatus 100 then performs the backup line allocation based on the weighting coefficients of the fail lines, as described in relation to FIGS. 1 to 6 (S404).

The backup line allocation apparatus 100 then determines whether all of the fail bits can be repaired by the process of S404 (S406). If all of the fail bits can be repaired, the setting section 30 performs the repairing process on the memory 40 (S408). If some of the fail bits cannot be repaired, the backup line allocation apparatus 100 performs an unrepairable process that is designated by a user or the like (S410).

Figure 8:
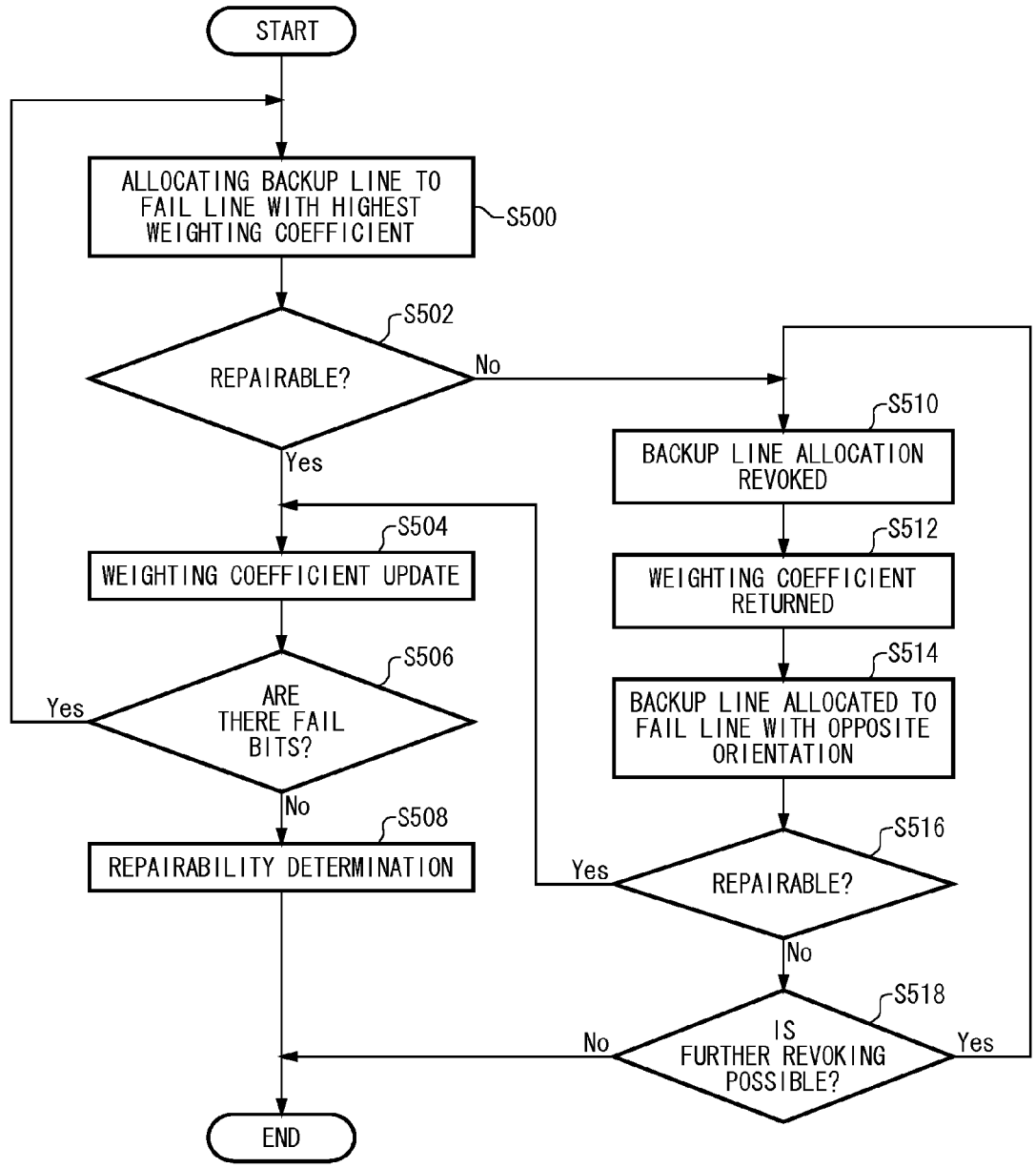
FIG. 8 is a flow chart showing an exemplary process corresponding to the allocation process S404 for allocating the backup lines, as described in FIG. 7.

FIG. 8 is a flow chart showing an exemplary process corresponding to the allocation process S404 for allocating the backup lines, as described in FIG. 7. As described above, the allocating section 130 allocates a backup line to the fail line having the highest weighting coefficient (S500). Next, when the allocating section 130 has allocated one backup line to a fail line, the repairability determining section 140 determines whether there is a chance that all of the fail bits can be repaired based on a predetermined determination standard (S502). For example, the repairability determining section 140 may determine whether there is a chance that all of the fail bits can be repaired based on the remaining fail bits and the number of remaining backup lines, as described above.

If it is determined at S502 that there is a chance that all of the fail bits can be repaired, the data in each register and memory in the bit counting section 110 and the weight calculating section 120 is updated. For example, the weight calculating section 120 updates the weighting coefficients (S504). The repairability determining section 140 then determines whether there are fail bits that are not repaired (S506). If it is determined at S506 that there are fail bits that are not repaired, the process repeats from S500, thereby sequentially allocating backup lines. If it is determined at S506 that there are no fail bits that are not repaired, it is determined that all of the fail bits can be repaired with this backup line allocation (S508). In this case, the setting section 30 performs the repairing process S508 as described in FIG. 7.

If it is determined at S502 that there is no chance that all of the fail bits can be repaired, the allocating section 130 revokes the backup line allocation set immediately therebefore (S510). The data in each register and memory in the bit counting section 110 and the weight calculating section 120 is then returned to the state that the data was in prior to this backup line allocation. For example, the weight calculating section 120 may recalculate the weighting coefficients for the state immediately prior to this backup line allocation (S512).

Next, the allocating section 130 selects second fail lines, which include the fail bits of the first fail line whose backup line allocation was revoked and are orthogonal to the first fail line, and allocates backup lines to the selected second fail lines (S514). The repairability determining section 140 then determines whether there is a chance that all of the fail bits can be repaired (S516).

If it is determined at S516 that there is a chance that all of the fail bits can be repaired, the processes from S504 onward are performed based on the current backup line allocation. If it is determined at S516 that some of the fail bits cannot be repaired, the allocating section 130 may determine whether an earlier backup line allocation can be revoked (S518). For example, the allocating section 130 may determine that an earlier backup line allocation cannot be revoked if the all of the backup line allocations have already been revoked to bring the memory 40 back to the initial state.

If it is determined at S518 that an earlier backup line allocation can be revoked, the process returns to S510 and the allocating section 130 revokes the immediately prior backup line allocation. If it is determined at S518 that an earlier backup line allocation cannot be revoked, then there is no possible backup line allocation that can repair all of the fail bits in the memory 40, and so the process ends. In such a case, the unrepairable process S410 is performed, as described in FIG. 7. Through the above processes, the backup line allocation apparatus 100 can efficiently detect a suitable backup line allocation.

In the examples above, the weighting coefficient of each fail line is updated each time a backup line is allocated, but the backup line allocation apparatus 100 need not update the weighting coefficient of each fail line. In such a case, the backup line allocation apparatus 100 may omit the weighting coefficient update process S504 and the weighting coefficient recalculation process S512 from the process flow shown in FIG. 8. This process flow also enables the backup line allocation apparatus 100 to efficiently detect a suitable backup line allocation.

Furthermore, in the exemplary process of FIG. 8, if it is determined at S502 that not all of the fail bits can be repaired, the most recent backup line allocation is revoked (S512). Instead, the process of S512 may involve revoking the first backup line allocation that was performed at S500. In such a case, the process of S512 returns each register and memory in the bit counting section 110 and the weight calculating section 120 to the initial state. Furthermore, prior to the process of S500, the allocating section 130 may allocate backup lines in advance to fail lines containing a predetermined number of fail bits.

Figure 9:
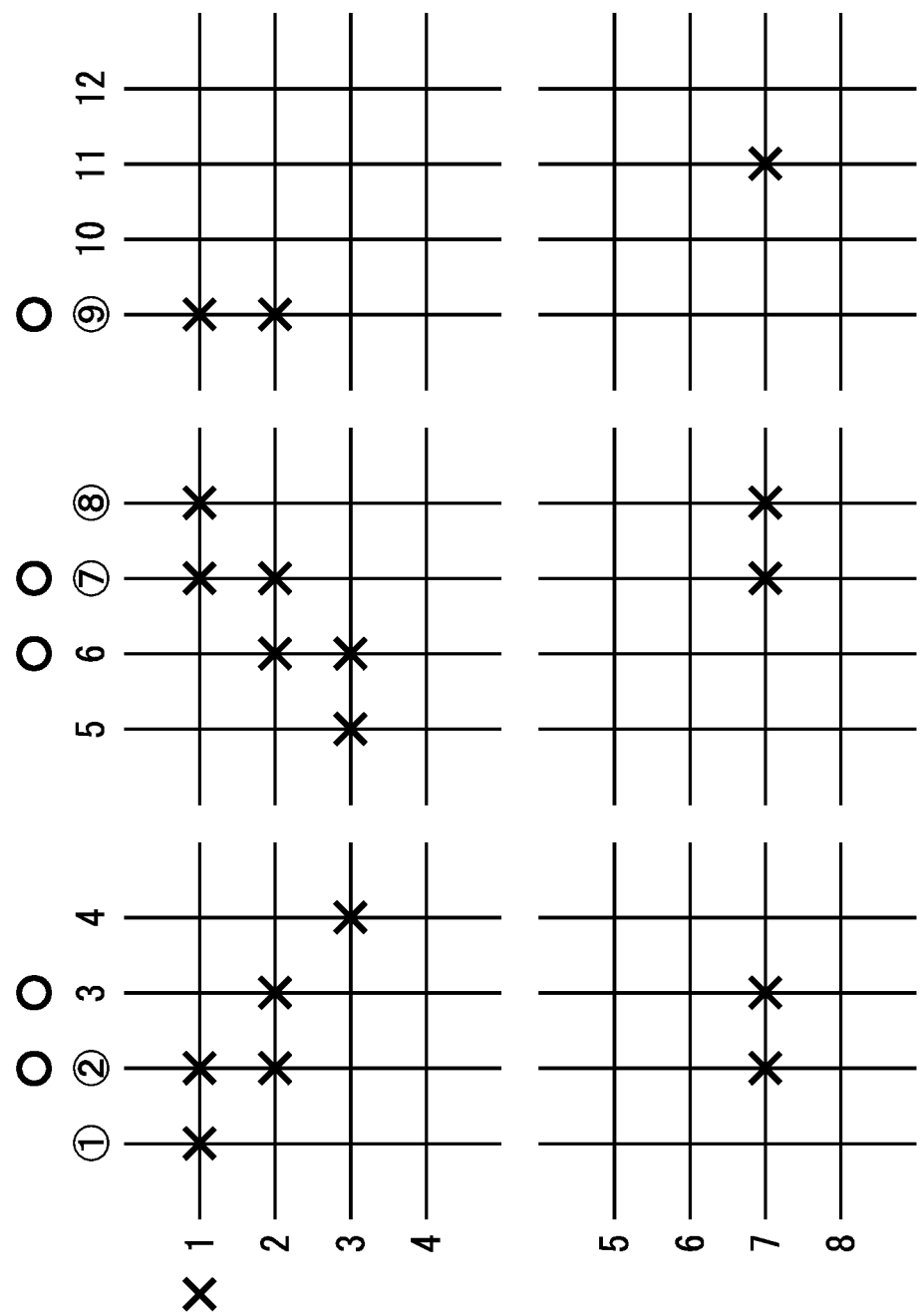
FIG. 9 shows another example of fail data in the memory 40.

FIG. 9 shows another example of fail data in the memory 40. The storage region of this memory 40 is divided into a plurality of storage blocks in at least one of a row direction and a column direction. In the example of FIG. 9, the storage region of the memory 40 is divided into three blocks in the row direction and two blocks in the column direction. The memory 40 may have row-oriented and column-oriented backup lines for each storage block.

When the process of step S502 shown in FIG. 8 is applied to this memory 40 and the repairability determining section 140 determines that some of the fail bits cannot be repaired, the immediately prior allocation of a backup line to the first fail line is revoked (S510). At S514, the allocating section 130 selects third fail lines in each storage block that have the same orientation as the first fail line and that contain the same number of fail bits as the first fail line, and irrevocably allocates backup lines to the selected third fail lines. At this time, the allocating section 130 may allocate backup lines to both the second fail lines described above and the third fail lines.

For example, the following describes a situation where a backup line is allocated to row address line 1 shown in FIG. 9 according to the process of S500 shown in FIG. 8. In this situation, if it is determined that some of the fail bits cannot be repaired (S502), row address lines 1, 2, 7, 8, and 9 are selected as the second fail lines according to the process of S514. Furthermore, the number of fail bits contained in row address line 2 in each storage block is the same as the number of fail bits contained in row address line 1 in each storage block, and so the allocating section 130 selects the third fail lines to be column address lines 2, 3, 6, 7, and 9, which include the fail bits of row address line 2 and are orthogonal to row address line 2.

The allocating section 130 then irrevocably allocates backup lines to the selected second and third fail lines (S514). Therefore, when backup lines are provided to each of the storage blocks, if not all of the fail bits can be repaired as a result of allocating a backup line to a certain fail line, there is a high chance that the fail bits of a fail line containing the same number of fail bits per storage block as the certain fail line will also be unrepairable when a backup line is allocated to this fail line. By irrevocably allocating backup lines to the third fail lines that are orthogonal to this fail line, the search for suitable backup line allocation can be performed even more efficiently.

Figure 10:
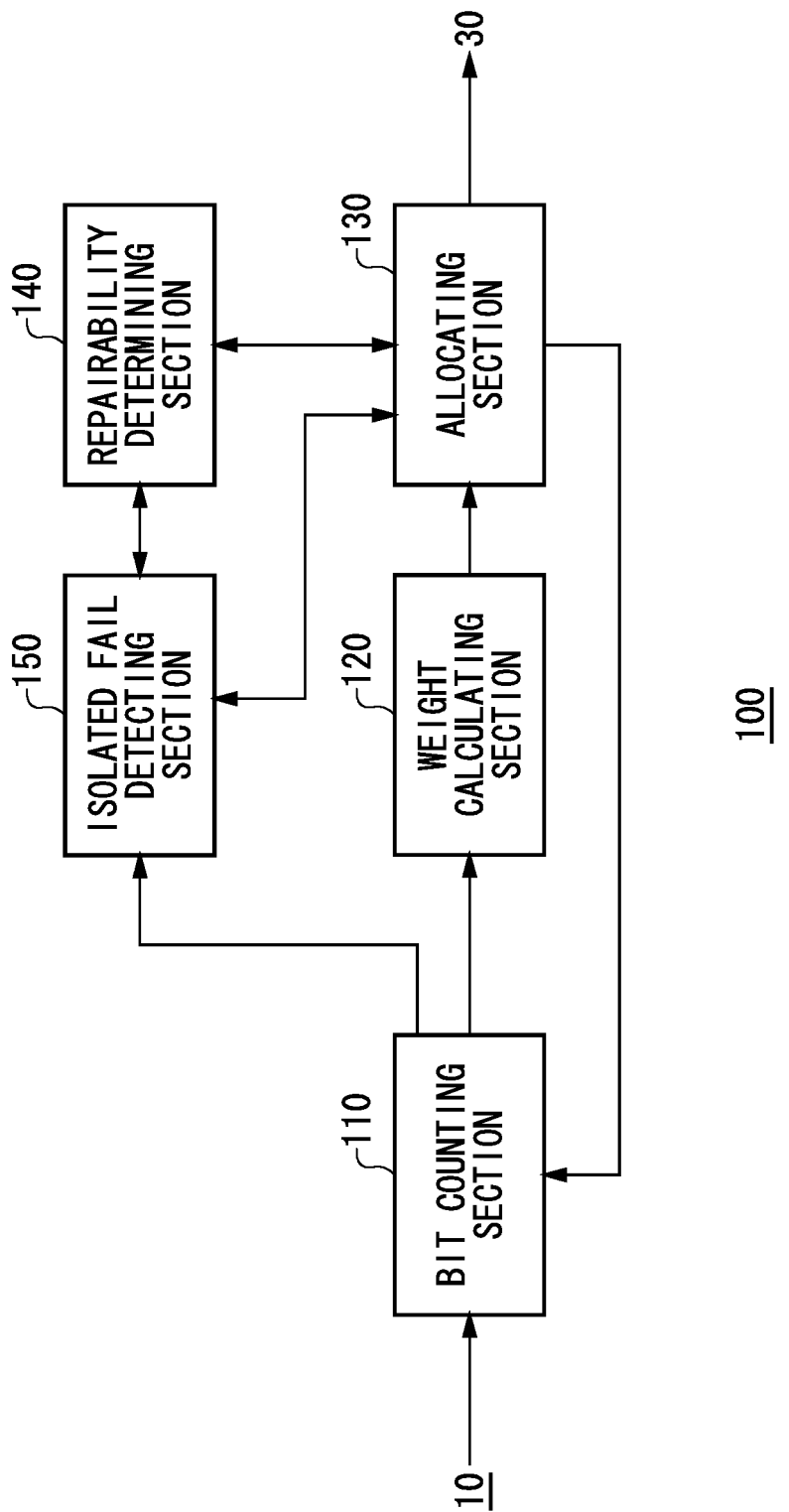
FIG. 10 shows another exemplary configuration of the backup line allocation apparatus 100.

FIG. 10 shows another exemplary configuration of the backup line allocation apparatus 100. The backup line allocation apparatus 100 of the present embodiment includes an isolated fail detecting section 150 in addition to the configuration of the backup line allocation apparatus 100 described in relation to FIG. 5. Other components of the backup line allocation apparatus 100 of the present embodiment may be the same as those of the backup line allocation apparatus 100 described in relation to FIG. 5.

When a certain fail bit has no other fail bits in the same row and no other fail bits in the same column, the isolated fail detecting section 150 detects this fail bit as an isolated fail bit. In other words, when there is only one fail bit in a certain column-oriented fail line and there are no other fail bits in the row-oriented fail line that includes this fail bit and is orthogonal to the certain fail line, the isolated fail detecting section 150 detects this fail bit as an isolated fail bit. The isolated fail detecting section 150 may sequentially detect isolated fail bits based on the fail data bit map sequentially updated and stored by the bit counting section 110, for each state of the bit map.

Figure 11:
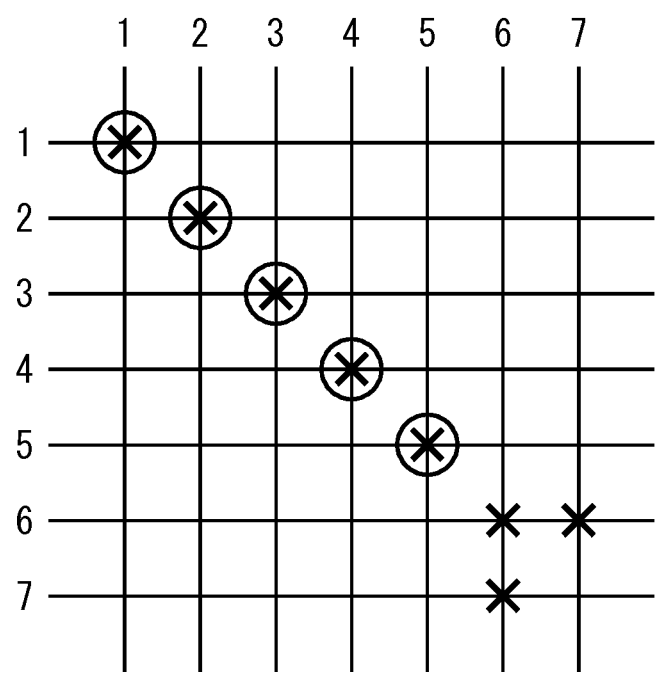
FIG. 11 shows an exemplary fail data bit map supplied to the isolated fail detecting section 150.

FIG. 11 shows an exemplary fail data bit map supplied to the isolated fail detecting section 150. As described above, the isolated fail detecting section 150 may detect the isolated fail bits based on this bit map. In the present example, the isolated fail detecting section 150 detects five isolated fail bits at (1, 1), (2, 2), (3, 3), (4, 4), and (5, 5).

During the processes of S502 and S516 in FIG. 8, the repairability determining section 140 may determine whether there is a chance that all of the fail bits can be repaired based on the number of isolated fail bits and the number of remaining backup lines. For example, the repairability determining section 140 may determine that there is no chance of repairing all of the fail bits when the sum of the number of row-oriented backup lines and the number of column-oriented backup lines is less than the number of isolated fail bits.

During the process of S500 in FIG. 8, the allocating section 130 may select the fail line to which a backup line is to be irrevocably allocated based on the number of isolated fail bits and the number of remaining backup lines. For example, the allocating section 130 may allocate, to fail lines of any orientation containing an isolated fail bit, a number of row-oriented backup lines obtained as the result of subtracting the number of remaining column-oriented backup lines from the number of isolated fail bits.

For example, if there are five isolated fail bits and two remaining column-oriented backup lines, the allocating section 130 allocates three row-oriented backup lines to any three row-oriented fail lines that include an isolated fail bit. In the same way, if there are five isolated fail bits and four remaining row-oriented backup lines, the allocating section 130 allocates one column-oriented backup line to an arbitrary column-oriented fail line that includes an isolated fail bit.

The maximum value of the number of isolated fail bits that can be repaired by the backup lines of each orientation is equal to the number of remaining backup lines of the corresponding orientation. Therefore, when the number of remaining backup lines "a" having one of the row orientation or the column orientation is less than the number of isolated fail bits "b," at least "b-a" isolated fail bits must be repaired using backup lines having the other orientation.

Therefore, as described above, the backup line allocation apparatus 100 can search for a suitable backup line orientation by irrevocably allocating the backup lines based on the number of isolated fail bits and the number of remaining backup lines. Furthermore, the isolated fail detecting section 150 may detect the isolated fail bits for each state of a bit map from which the fail bits of the fail lines are removed each time the allocating section 130 allocates a backup line to a fail line based on the weighting coefficients. The isolated fail detecting section 150 may include a register that stores the isolated fail bits in each state.

When all of the fail bits that have yet to be repaired are isolated fail bits and not all of the backup lines are allocated, all of the fail bits are determined to be repairable if the number of isolated fail bits is less than the number of remaining backup lines. In such a case, the allocating section 130 may allocate the backup lines to all of the remaining fail lines and then end the allocation process. For example, the allocating section 130 may prioritize backup lines with an orientation designated in advance by the user or the like, and allocate backup lines to the remaining fail lines according to this prioritization.

The processes relating to the isolated fail bits, as described in relation to FIGS. 10 and 11, may be performed for each storage block described in relation to FIG. 9. For example, the repairability determining section 140 may determine that there is no chance that all of the fail bits can be repaired when the sum of the remaining row-oriented backup lines and remaining column-oriented backup lines is less than the number of isolated fail bits, in any one of the storage blocks.

Figure 12:
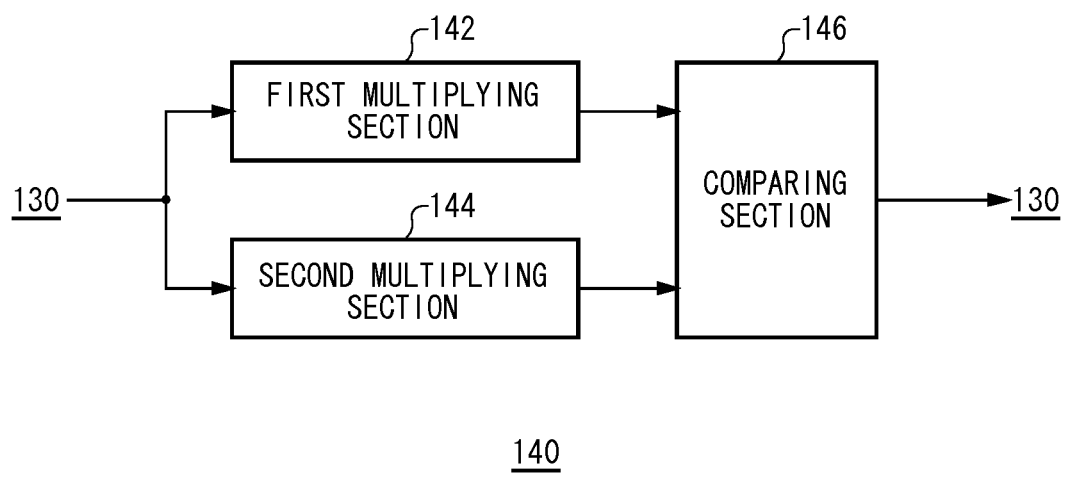
FIG. 12 shows an exemplary configuration of a portion of the repairability determining section 140.

FIG. 12 shows an exemplary configuration of a portion of the repairability determining section 140. The repairability determining section 140 of the present embodiment includes a first multiplying section 142, a second multiplying section 144, and a comparing section 146 in addition to the configuration for performing the functions described in relation to FIGS. 1 to 11.

The first multiplying section 142 calculates a first multiplied value by multiplying the maximum number of fail bits included in a column-oriented fail line by the number of remaining column-oriented backup lines. In other words, the first multiplied value indicates the maximum number of fail bits that can be repaired by the remaining column-oriented backup lines. The second multiplying section 144 calculates a second multiplied value by multiplying the maximum number of fail bits included in a row-oriented fail line by the number of remaining row-oriented backup lines. In other words, the second multiplied value indicates the maximum number of fail bits that can be repaired by the remaining row-oriented backup lines.

The comparing section 146 determines whether the sum of the first multiplied value and the second multiplied value is less than the total number of remaining fail bits. If the sum of the first multiplied value and the second multiplied value is less than the total number of remaining fail bits, not all of the fail bits can be repaired by the remaining backup lines. In such a case, the comparing section 146 notifies the allocating section 130 of this fact.

Figure 13:
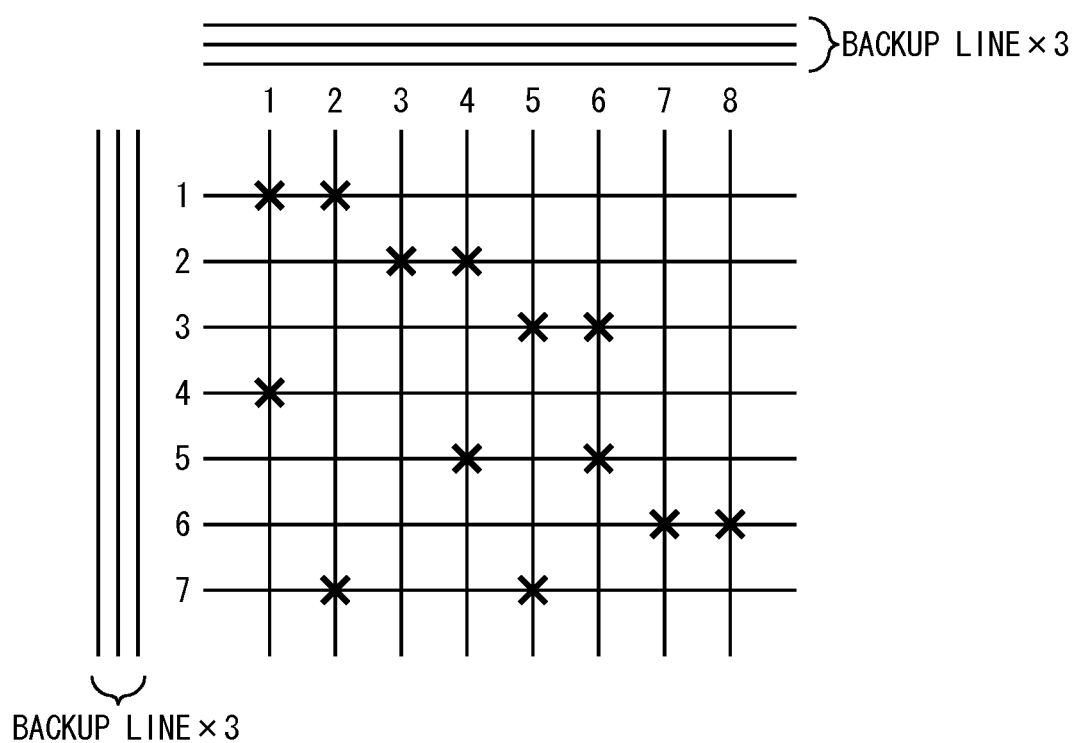
FIG. 13 shows an exemplary bit map of fail bits.

FIG. 13 shows an exemplary bit map of fail bits. The total number of fail bits in this bit map is 13, and there are three row-oriented backup lines and three column-oriented backup lines remaining.

The first multiplying section 142 detects the maximum number of fail bits included in a row-oriented fail line. As shown in FIG. 13, the maximum number of fail bits in a row is two. The first multiplying section 142 calculates the first multiplied value by multiplying the maximum number of fail bits by the number of remaining backup lines, i.e. 2×3=6.

In the same way, the second multiplying section 144 detects the maximum number of fail bits included in a column-oriented fail line. As shown in FIG. 13, the maximum number of fail bits in a column is two. The second multiplying section 144 calculates the second multiplied value by multiplying the maximum number of fail bits by the number of remaining backup lines, i.e. 2×3=6.

As a result, the sum of the first multiplied value and the second multiplied value in the present example is 12, which is less than the 13 remaining fail bits. Therefore, the comparing section 146 notifies the allocating section 130 that not all of the fail bits can be repaired. With this process, the line allocation apparatus 100 can more quickly detect that there is no chance of repairing all of the fail bits, and can therefore more efficiently search for a suitable backup line allocation.

The repairability determining section 140 may perform the process using the first and second multiplied values described in relation to FIGS. 12 and 13 for each of the storage blocks described in relation to FIG. 9. For example, when the sum of the first multiplied value and the second multiplied value is less then the number of remaining fail bits in any one of the storage blocks, the repairability determining section 140 may determine that there is no chance that all of the fail bits can be repaired.

Figure 14:
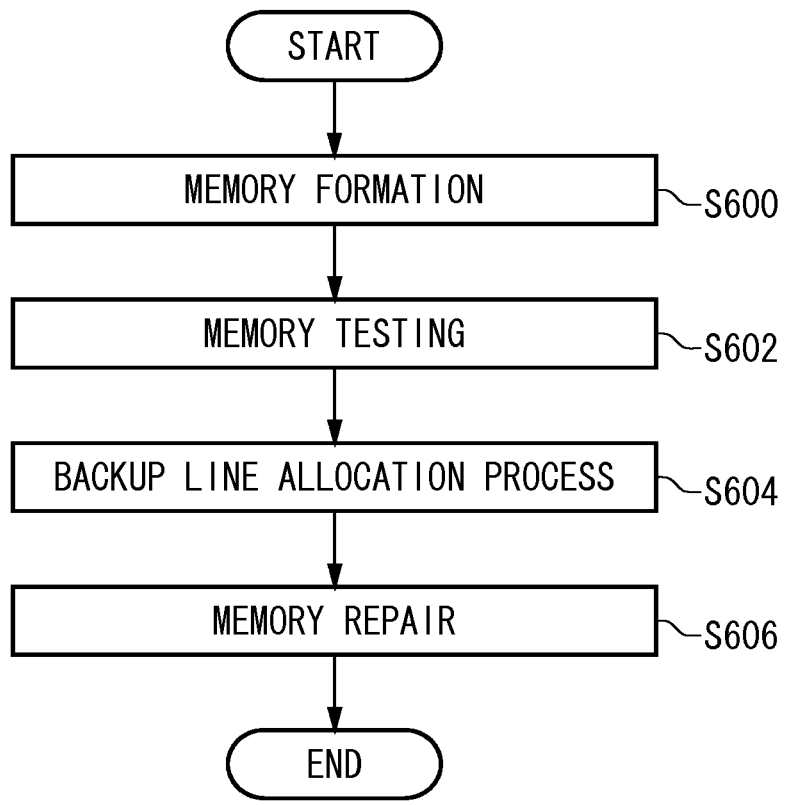
FIG. 14 is a flow chart showing an exemplary memory manufacturing method according to an embodiment of the present invention.

FIG. 14 is a flow chart showing an exemplary memory manufacturing method according to an embodiment of the present invention. The memory manufacturing method uses the backup line allocation method and the memory repair method described in relation to FIGS. 1 to 13 to manufacture a memory 40, such as a semiconductor memory.

First, during memory formation, a memory 40 is formed that is provided with a plurality of backup lines (S600). Next, the memory 40 is tested to generate fail data concerning the memory 40 (S602).

Next, during backup line allocation, a determination is made as to which fail lines are to have backup lines allocated thereto from among the row-oriented fail lines and column-oriented fail lines containing fail bits in the memory 40 (S604). The process of S604 is performed using the backup line allocation apparatus 100 described in relation to FIGS. 1 to 13.

A non-defective memory 40 is then manufactured by setting the determined backup line allocation in the memory 40 to repair the memory 40 (S606). The process of S606 may be performed using the setting section 30 described in relation to FIGS. 1 to 13. With this processes, a non-defective memory 40 can be manufactured efficiently.

Figure 15:
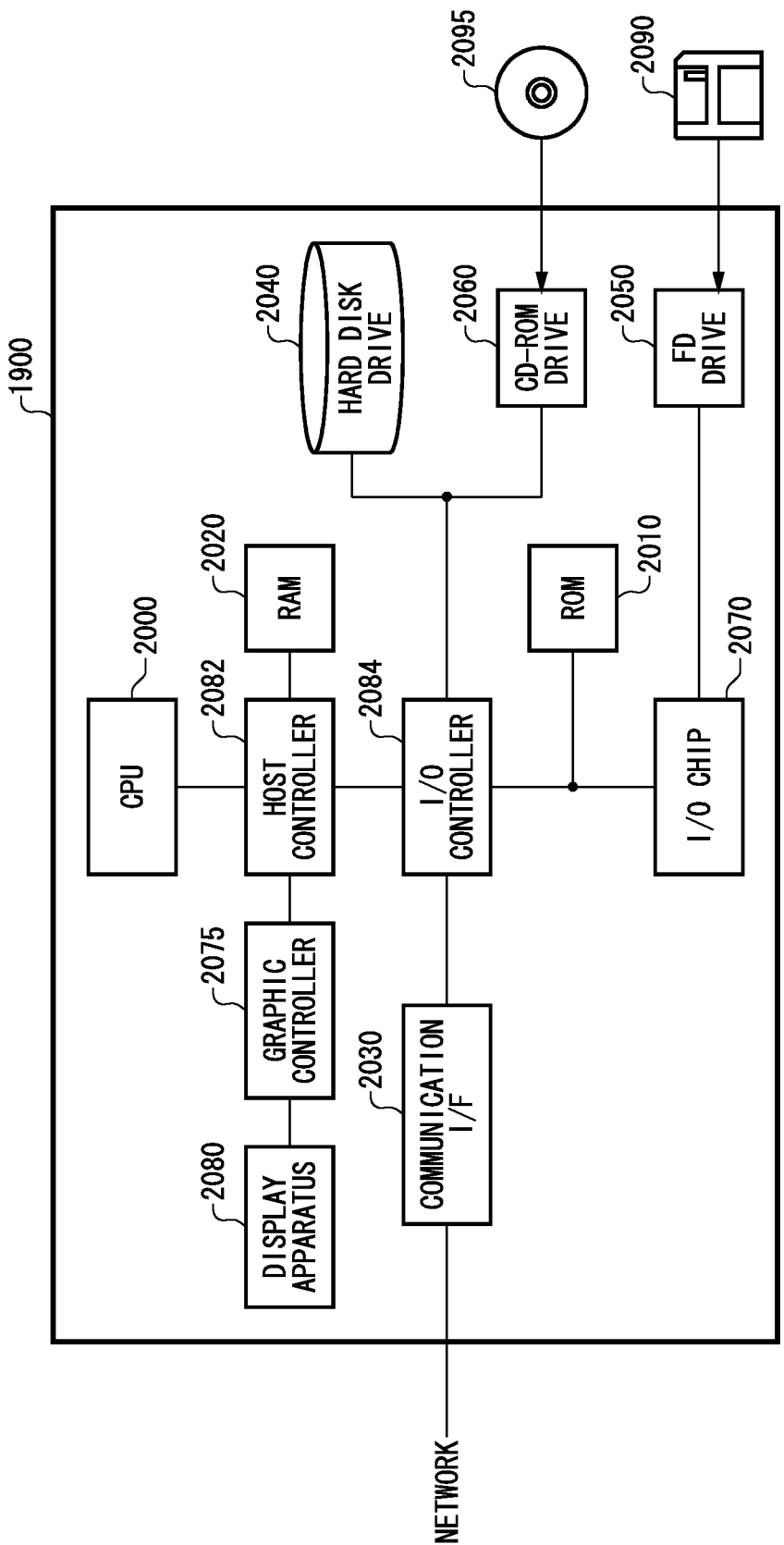
FIG. 15 shows an example of a hardware configuration of a computer 1900 according to the present embodiment.

FIG. 15 shows an example of a hardware configuration of a computer 1900 according to the present embodiment. The computer 1900 may function as the backup line allocation apparatus 100 described in relation to FIGS. 1 to 14, based on a program provided thereto.

When the computer 1900 functions as the backup line allocation apparatus 100, the program may cause the computer 1900 to function as at least one of the bit counting section 110, the weight calculating section 120, the allocating section 130, the repairability determining section 140, and the isolated fail detecting section 150 described in relation to FIGS. 1 to 14. For example, the program may cause a CPU 2000 to function as the bit counting section 110, the weight calculating section 120, the allocating section 130, the repairability determining section 140, and the isolated fail detecting section 150, and may cause a hard disk drive 2040 or a RAM 2020 to function as each register and memory in the bit counting section 110, the weight calculating section 120, and the allocating section 130.

The computer 1900 according to the present embodiment is provided with a CPU peripheral including the CPU 2000, the RAM 2020, a graphic controller 2075, and a display apparatus 2080, all of which are connected to each other by a host controller 2082; an input/output section including a communication interface 2030, the hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the display apparatus 2080. Instead, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. For example, the communication interface 2030 may enable communication between the memory test apparatus 10 and the setting section 30. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

The programs are installed in the computer 1900. These programs prompt the CPU 2000 or the like to make the computer 1900 function as each section of the backup line allocation apparatus 100 described above.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As described above, the backup line allocation apparatus 100 of the present invention can efficiently search for a suitable backup line allocation. Furthermore, the memory repairing apparatus 20 can efficiently repair the memory.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A backup line allocation apparatus that determines which fail lines, from among row-oriented fail lines and column-oriented fail lines containing fail bits in a memory provided with a plurality of backup lines, to allocate the backup lines to, comprising:
   a bit counting section that, for each fail bit contained in each fail line, counts a number of orthogonal fail bits, which is a number of fail bits in a fail line that includes the each fail bit and has an orientation that differs from the orientation of the each fail line, and stores the number of orthogonal fail bits associated with the each fail bit;
   a weight calculating section that calculates a weighting coefficient for each fail line based on the number of orthogonal fail bits of the fail bits contained in the each fail line, and stores the weighting coefficient associated with the each fail line; and
   an allocating section that determines which of the fail lines to allocate the backup lines to, based on the relative sizes of the weighting coefficients calculated by the weight calculating section.

2. The backup line allocation apparatus according to claim 1, wherein
   the bit counting section counts, for each of the fail bits, the number of orthogonal fail bits in the row-oriented fail line thereof and in the column-oriented fail line thereof.

3. The backup line allocation apparatus according, to claim 2, wherein
   the weight calculating section calculates the weighting coefficient of each fail line based on a sum of reciprocals of the numbers of orthogonal fail bits of the fail bits contained in the each fail line.

4. The backup line allocation apparatus according to claim 2, wherein
   the allocating section allocates a backup line to one of the fail lines based on the weighting coefficients,
   the weight calculating section calculates the weighting coefficient of each fail line while excluding fail bits contained in fail lines to which backup lines are allocated, and stores each new weighting coefficient associated with the corresponding fail line, and
   the allocating section selects the next fail line to which a backup line is to be allocated based on the new weighting coefficients stored by the weight calculating section.

5. The backup line allocation apparatus according to claim 4, wherein
   the allocating section sequentially allocates the backup lines to fail lines having the largest weighting coefficients,
   the backup line allocation apparatus further comprises a repairability determining section that determines whether all of the fail bits can be repaired if the backup lines are sequentially allocated, to the fail lines having the largest weighting coefficients, and when the repairability determining section determines that some of the fail bits cannot be repaired, the allocating section (i) revokes the allocation of a backup line to a first fail line, which is a fail line to which a backup line has already been allocated, (ii) selects second fail lines that each include a fail bit contained in the first fail line and have an orientation differing from the orientation of the first fail line, and (iii) allocates backup lines to the second fail lines.

6. The backup line allocation apparatus according to claim 5, wherein when the repairability determining section determines that some of the fail bits cannot be repaired, the weight calculating section recalculates the weighting coefficients to be what the weighting coefficients were prior to the allocation of the backup line to the first fail line.

7. The backup line allocation apparatus according, to claim 6, wherein each time the allocating section allocates one backup line to a fail line, the repairability determining section determines whether there is a chance that all of the fail bits can be repaired, based on a predetermined determination standard, and when the repairability determining section determines that there is no chance that all of the fail bits can be repaired, the allocating section revokes the allocation of the backup line, to the first fail line that is the most recent fail line to which a backup line was allocated.

8. The backup line allocation apparatus according to claim 6, wherein each time the allocating section allocates one backup line to a fail line, the repairability determining section determines whether there is a chance that all of the fail bits can be repaired, based on a predetermined determination standard, and when the repairability determining section determines that there is no chance that all of the fail hits can be repaired, the allocating section revokes the allocation of the backup line to the first fail line that is the fail line to which a backup line was first allocated.

9. The backup line allocation apparatus according to claim 5, wherein a storage area of the memory is divided into a plurality of storage blocks in at least one of a column direction and a row direction, and the memory includes backup lines for each storage block, and when the repairability determining section determines that some of the fail bits cannot be repaired, the allocating section further allocates backup lines to fail lines that have the same orientation as the first fail line and that have the same number of fail bits in each storage block as the first fail line.

10. The backup line allocation apparatus according to claim 1, wherein the allocating section allocates the backup lines in advance to fail lines containing a predetermined number of fail bits.

11. The backup line allocation apparatus according to claim 1, further comprising an isolated fail detecting section that, when both the row-oriented fail line and the column-oriented fail line of a fail bit contain no other fail bits, detects the fail bit as an isolated fail bit, wherein the allocating section allocates a number of row-oriented backup lines to fail lines that include isolated fail bits, the number of allocated row-oriented backup lines corresponding to a result obtained by subtracting the number of column-oriented backup lines that have not been allocated to fail lines from the number of isolated fail bits, and the allocating, section allocates a number of column-oriented backup lines to the fail lines that include isolated fail bits, the number of allocated column-oriented backup lines corresponding to a result obtained by subtracting the number of row-oriented backup lines that have not been allocated to fail lines from the number of isolated fail bits.

12. The backup line allocation apparatus according to claim 11, wherein each time the allocating section allocates a backup line to a fail line, the isolated fail detecting section detects the isolated fail bits while excluding fail bits of the fail lines to which backup lines are allocated.

13. The backup line allocation apparatus according to claim 11, wherein when all of the fail bits to which a backup line has not been allocated are isolated fail bits, the allocating section prioritizes backup lines having a predetermined orientation and allocates the backup lines to the fail lines according to this prioritization.

14. The backup line allocation apparatus according to claim 9, wherein the repairability determining section includes:

a first multiplying section that calculates, for each storage block, a first multiplied value by multiplying (i) a maximum number of fail bits contained in a column-oriented fail line by (ii) the number of backup lines that have not been allocated to fail lines from among the column-oriented backup lines associated with the each storage block;

a second multiplying section that calculates, for each storage block, a second multiplied value by multiplying (iii) a maximum number of fail bits contained in a row-oriented fail line by (iv) the number of backup lines that have not been allocated to fail lines from among the row-oriented backup lines associated with the each storage block; and a comparing section that, for each storage block, determines whether a sum of the first multiplied value and the second multiplied value is less than a total number of fail bits included in the each storage block and, when the sum of the multiplied values is determined to be less than the total number of fail bits in an one of the each storage blocks, determines that not all of the fall bits can be repaired.

15. A memory repairing, apparatus that repairs fail bits of a memory provided with a plurality of backup lines, comprising:

the backkup line allocation apparatus according to claim 1 that determines which fail lines, from among row-oriented fail lines and column-oriented fail lines containing fail bits in the memory, to allocate the backup lines to; and a setting section that sets the allocation determined by the backup line allocation apparatus in the memory.

16. A backup line allocation method for determining which fail lines, from among row-oriented fail lines and column-oriented fail lines containing fail bits in a memory provided with a plurality of backup lines, to allocate the backup lines to, comprising:

for each fail bit contained in each fail hue, counting, a number of orthogonal fail bits, which is a number of fail bits in a fail line that includes the each fail bit and has an orientation that differs from the orientation of the each fail line, and storing the number of orthogonal fail bits associated with the each fail bit;

calculating a weighting coefficient for each fail line based on the number of orthogonal fail bits of the fail bits contained in the each fail line, and storing the weighting coefficient associated with the each fail line; and determining which of the fail lines to allocate the backup lines to, based on the relative sizes of the weighting coefficients.

17. A memory manufacturing method for manufacturing a memory, comprising:

forming the memory provided with a plurality of backup lines; and repairing the memory by determining which fail lines, from among row-oriented fail lines and column-oriented fail lines containing fail bits in the formed memory, to allocate the backup lines to, wherein repairing the memory includes using the backup line allocation method according to claim 16 to determine which of the fail lines to allocate the backup lines to.

18. A non-transitory recording medium storing thereon a program that causes a computer to function as a backup line allocation apparatus that determines which fail lines, from among row-oriented fail lines and column-oriented fail lines containing fail bits in a memory provided with a plurality of backup lines, to allocate the backup lines to, the backup line allocation apparatus comprising:

a bit counting section that, for each fail bit contained in each fail line, counts a number of orthogonal fail bits, which is a number of fail bits in a fail line that includes the each fail bit and has an orientation that differs from the orientation of the each fail line, and stores the number of orthogonal fail bits associated with the each fail bit;

a weight calculating section that calculates a weighting coefficient for each fail line based on the number of orthogonal fail bits of the fail bits contained in the each fail line, and stores the weighting coefficient associated with the each fail line; and an allocating section that determines which of the fail lines to allocate the backup lines to, based on the relative sizes of the weighting coefficients calculated by the weight calculating section.

* * * * *